(12) United States Patent
Franz et al.

(10) Patent No.: US 10,734,760 B2
(45) Date of Patent: Aug. 4, 2020

(54) MAGNETIC FLUID CONNECTOR

(71) Applicant: HEWLETT PACKARD ENTERPRISE DEVELOPMENT LP, Houston, TX (US)

(72) Inventors: John P. Franz, Houston, TX (US); Tahir Cader, Liberty Lake, WA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 16/533,723

(22) Filed: Aug. 6, 2019

(65) Prior Publication Data
US 2019/0363485 A1    Nov. 28, 2019

Related U.S. Application Data

(63) Continuation of application No. 15/561,606, filed as application No. PCT/US2015/025694 on Apr. 14, 2015, now Pat. No. 10,431,926.

(51) Int. Cl.
*H01R 13/62* (2006.01)
*H01R 13/52* (2006.01)
(Continued)

(52) U.S. Cl.
CPC ..... *H01R 13/6205* (2013.01); *H01R 13/5219* (2013.01); *H01R 25/14* (2013.01); *H05K 7/20809* (2013.01); *F16L 29/02* (2013.01)

(58) Field of Classification Search
CPC ............ H01R 13/6205; H01R 13/5219; H01R 25/14; H05K 7/20809; H05K 7/20272;
(Continued)

(56) References Cited

U.S. PATENT DOCUMENTS 3,233,625 A * 2/1966 Pase ...................... F16K 31/086
  137/416
3,364,897 A * 1/1968 Mouwen .............. B01D 35/143
  165/80.3

(Continued)

FOREIGN PATENT DOCUMENTS

CN      202679218 U      1/2013
DE    102015004691 A1 * 10/2016 ........... F16K 31/084
(Continued)

OTHER PUBLICATIONS

Hubner, Flow Control Device, Oct. 13, 2016, IP.com English translation of DE102015004691A1.*
(Continued)

*Primary Examiner* — James Wu
*Assistant Examiner* — Michael A Matey
(74) *Attorney, Agent, or Firm* — Hewlett Packard Enterprise Patent Department

(57) ABSTRACT

Example implementations relate to a magnetic fluid connector. For example, a magnetic fluid connector can include a magnet, an internal fluid path defined by a first portion and a second portion when the first portion and the second portion are coupled together, and a movable member that is movable to seal the internal fluid path, where the magnet provides at least a portion of a force sufficient to seal the internal fluid path.

19 Claims, 5 Drawing Sheets

(51) Int. Cl.
*H01R 25/14* (2006.01)
*H05K 7/20* (2006.01)
*F16L 29/02* (2006.01)

(58) Field of Classification Search
CPC ........ F16L 29/02; Y10T 24/32; H01F 7/0263; A41F 1/002; G06F 1/20
See application file for complete search history.

(56) References Cited

U.S. PATENT DOCUMENTS

| | | | | |
|---|---|---|---|---|
| 3,568,625 | A | * | 3/1971 | Cilento ................ B01D 35/143 116/267 |
| 3,595,200 | A | * | 7/1971 | Cilento ................ B01D 35/143 116/267 |
| 3,696,837 | A | | 10/1972 | Reip |
| 4,865,588 | A | * | 9/1989 | Flinchbaugh ......... A61F 5/4405 604/129 |
| 5,237,957 | A | * | 8/1993 | Liucci .................... G01L 19/12 116/267 |
| 5,320,136 | A | * | 6/1994 | Morris .................. F16K 15/021 137/516.29 |
| 5,492,305 | A | | 2/1996 | Kish |
| 5,567,131 | A | * | 10/1996 | McNaull ............... F04B 17/046 137/539 |
| 7,447,026 | B2 | | 11/2008 | Murakami et al. |
| 7,486,514 | B2 | | 2/2009 | Campbell et al. |
| 8,454,059 | B2 | | 6/2013 | Stell |
| 8,922,998 | B2 | | 12/2014 | Campbell et al. |
| 8,952,774 | B2 | | 2/2015 | Dolgonos |
| 9,879,668 | B2 | | 1/2018 | Yavorsky et al. |
| 2004/0003487 | A1 | | 1/2004 | Reiter |
| 2006/0042260 | A1 | * | 3/2006 | Webster ................ F01D 17/085 60/772 |
| 2006/0054402 | A1 | * | 3/2006 | Dorian ............... F01M 11/0408 184/1.5 |
| 2007/0235180 | A1 | | 10/2007 | Ouyang et al. |
| 2008/0145739 | A1 | * | 6/2008 | Adams .................. F16K 15/063 429/443 |
| 2009/0250021 | A1 | * | 10/2009 | Zarrabi .................... F01L 1/352 123/90.11 |
| 2010/0225430 | A1 | * | 9/2010 | Fullerton ................ G01D 1/00 335/306 |
| 2011/0317367 | A1 | | 12/2011 | Campbell et al. |
| 2013/0174914 | A1 | * | 7/2013 | McAvey ............... B67D 7/3218 137/2 |
| 2014/0030046 | A1 | | 1/2014 | Perio |
| 2017/0030497 | A1 | | 2/2017 | Bai et al. |
| 2017/0182306 | A1 | * | 6/2017 | Swantner ............... A61M 39/10 |
| 2017/0261141 | A1 | * | 9/2017 | Liu .......................... B41J 27/00 |
| 2018/0094743 | A1 | * | 4/2018 | Hubner ................. F16K 31/084 |
| 2019/0090579 | A1 | * | 3/2019 | Hernandez Torres ....................... A42B 3/286 |
| 2019/0153377 | A1 | * | 5/2019 | Shimase ................ C12M 37/04 |

FOREIGN PATENT DOCUMENTS

| | | |
|---|---|---|
| JP | 2001-170188 A | 6/2001 |
| JP | 2002-372343 A | 12/2002 |
| JP | 2004-316805 A | 11/2004 |
| JP | 2010-258244 A | 11/2010 |
| TW | 201002972 A | 1/2010 |
| TW | 201405035 A | 2/2014 |
| WO | 2014/030046 A1 | 2/2014 |

OTHER PUBLICATIONS

SIE Computing Solutions, Inc.; "Liquid Cooled ATR Enclosures Are Configurable"; Nov. 6, 2009, 7 pages.

* cited by examiner

MAGNETIC FLUID CONNECTOR

BACKGROUND

Electronic devices can have temperatures at which they are desirably operated. An electronic device can malfunction if an operating temperature of the electronic device reaches and/or exceeds a threshold temperature. Heat from the use of the electronic devices can be controlled using cooling systems. Example cooling systems include air and liquid cooling systems.

DETAILED DESCRIPTION

Figure 1:
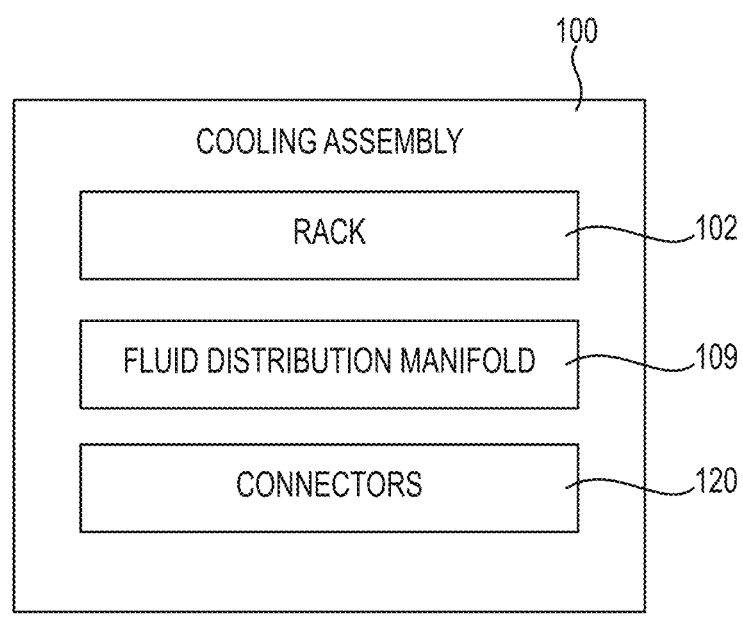
FIG. 1 illustrates a diagram of an example of a cooling assembly.

Electronic systems can be designed to balance conflicts between power density, spatial layout, desired operating temperatures, acoustic noise, and other factors. Air cooling systems can use heat sinks and fans to remove heat from the electronic systems. The use of heat sinks and fans may increase the electrical power to operate the electrical systems (e.g., a server device) and/or may cause acoustic noise, among other difficulties. Liquid cooling may be comparatively more efficient than air cooling; however, liquid cooling typically includes plumbing connections. As the liquid goes through the plumbing connections, the risk of leakage of the liquid within the electronic devices is introduced.

Liquid leakage can cause damage to the electronic devices. For example, liquid leaked can cause a server device to malfunction and/or terminate. To reduce damage, a dielectric fluid can be used and/or the liquid may be near the circuit but not in contact. However, dielectric fluids are expensive compared to other liquids, are hazardous (e.g., safety issues in handling and limitation in how to dispose of the liquid), and their thermal performance is lower than other liquids, such as water.

A cooling assembly can be used to have the liquid near but not in contact with the electronic device. The cooling assembly can include an enclosure such as a wall structure or other suitable enclosure with a fluid distribution manifold and/or a plurality of thermal bus bars (TBB) to carry fluid there through. A thermal bus bar, as used herein, can include a (rectangular) part that is filled with a number of fluid channels that allow cooling fluid to be pumped from a cooling fluid source (i.e., a cooling base). A cooling fluid source can include an enclosure that holds piping, pumps, and/or heat exchangers. Heat from the electronic devices can transfer to the cooling assembly via a dry disconnect. The cooling assembly is outside of the electronic device to enable the liquid cooling to occur away from the electronic devices. Put another way, a cooling assembly may be used to direct a fluid such as liquid coolant near but not in contact with the electronic device. This technique is known as Direct Liquid Cooling (DLC) where the fluid stays contained within tubes, hoses and/or manifolds and is transported throughout the server system.

Liquid cooling to electronic device may employ a connector (e.g., two connections) to provide and/or receive cooling fluid, and as a result, heat from the electronic device. However, again, such connectors may be prone to unintended leaks of cooling fluid. For example, manual quick connectors and/or blind mate dripless connectors (i.e., blind mate connectors) may "stick" in an open position and may cause an unintended leak. In an effort to address the same, some connectors may employ a spring that is intended to dispose the connector to a closed position (e.g., a position that does not allow coolant to leak or otherwise pass from the connector to an environment surrounding the connector). However, such approaches relying on may not provide adequate force to close the connector as desired (i.e., the connector may unintentionally leak), among other difficulties.

Examples in accordance with this disclosure include a magnetic fluid connector. The magnetic fluid connector can include a magnet, an internal fluid path defined by a first portion and a second portion when the first portion and the second portion are coupled together, and a movable member that is movable to seal the internal fluid path, where the magnet provides at least a portion of a force sufficient to seal the internal fluid path. Desirably, the magnetic fluid connector provides comparatively improved (greater) closure force compared to approaches relying on a spring (e.g., relying solely on a spring).

FIG. 1 illustrates a diagram of an example of a cooling assembly 100. In some embodiments, a cooling assembly 100 can include a shelf (not shown) (e.g., a removable shelf) installed in the cooling assembly 100. In some examples, the cooling assembly can be an adaptable cooling assembly including at least one component (e.g., a removable shelf and/or a removable TBB, etc.) that is to be altered and/or removed. A removable shelf, as used herein, is a support for holding an object that can be removed from the cooling assembly 100. The shelf can include a flat horizontal surface, for instance. In some example, the shelf can be removed to support an electronic device of a greater height than can be supported with the shelf installed. For example, each TBB can have a height of 1 rack unit (U). The shelf can be removed to support an electronic device with a height of 2 U or 1.5 U, among other possible heights.

In various examples, the cooling assembly 100 can include a rack 102. The rack 102 and/or a wall structure, such as those described herein, can include a shelf (not shown). The rack 102 and/or the wall structure can include a support for holding the TBBs and/or shelves. However, in some embodiments, the cooling assembly does not include a TBB and/or shelves. In some examples, the wall structure can include a frame that can be installed and/or is installed in the rack.

The rack 102 can be perpendicular to the shelf (e.g., vertical). In various examples, the rack 102 can include connectors for the TBBs and/or other of fluid channels that allow cooling fluid to be pumped from a cooling fluid source (i.e., a cooling base) to the TBBs, as discussed further herein. Further, the TBB can be removed to allow for different cooling techniques, such as air cooling and/or integrated liquid-cooled cold plate cooling, among other possibilities. Again, in some embodiments, the cooling assembly does not include a TBB. For example, such a cooling assembly without a TBB can include a rack 102, fluid distribution manifold 109, and connectors 120.

The shelf can form a slot. A slot can include a space designed to hold a unit of equipment. For instance, an electronic device can be installed in a slot. For example, an electronic device with integrated cooling can be installed in a slot. An electronic device with integrated cooling can include an electronic device with an integrated liquid-cooled cold plate and/or other liquid cooling techniques integrated into the electronic device. For example, an electronic device with integrated cooling can include a system on chip (SoC) or three-dimensional (3D) integrated package. The SoC or 3D integrated package installed can have integrated liquid cooling.

An electronic device with integrated liquid-cooled cold plate can include a cold plate located within the electronic device, as discussed further herein. Various different electronic devices (of a greater width and/or height) can be cooled using integrated cooling (e.g., liquid-cooled cold plate cooling) and/or air cooling. For example, integrated liquid-cooled cold plate cooling can be supported using connectors (e.g., blind mate connectors) as illustrated and discussed further in regards to FIG. 2.

The slot formed by the shelf can also include a cooling bay (not shown). That is, the cooling bay can be located in a slot formed by the shelf. A cooling bay can include a space designed to hold cooling equipment and/or other devices. For example, fluid distribution manifold 109 and/or a TBB (e.g., a removable TBB) can be installed in the cooling bay. The fluid distribution manifold 109 and/or TBB can provide liquid cooling to an electronic device. For instance, the electronic device can be installed in the slot formed by the shelf when the cooling assembly 100 and the electronic device are installed in a rack.

The cooling bay can include a pair of connectors 120. That is, the connectors can be at least partially included in the cooling bay. For example, a connector can include a connection point between inlet and/or outlet channels and the fluid distribution manifold 109 and/or an electronic device, such as an electronic device with integrated cooling. A pair (two) of connectors 120 in the cooling bay can connect to the particular fluid distribution manifold 109.

The TBB and/or the shelf can be removed from the cooling assembly 100, in some examples, to provide a variety of server solutions and performance options. For example, the TBB can be removed to install an electronic device that is a greater width than can be installed with the removable TBB installed. Alternatively and/or in addition, the TBB can be removed to provide a different type of cooling to an installed electronic device, such as air cooling and/or integrated liquid-cooled cold plate cooling. Further, the TBB can be removed to service the removable TBB and/or to replace the TBB with an upgraded TBB, such as higher performance materials, flow control, thermal interface, etc.

The shelf can be removed to install an electronic device that is a greater height than can be installed with the shelf installed. For example, as further illustrated by FIG. 2, the cooling assembly 100 can be of a particular dimension and the shelf can be installed at a particular height of the rack 102 and/or the wall structure.

The connectors 120 are blind mate connectors. Blind mate connectors, sometimes referred to as "blind mate dripless connectors", can include connectors that can translate (horizontally) to remove a gap and/or accommodate potential misalignment between an electronic device and a TBB and/or to connect to an electronic device with integrated cooling, as discussed further herein. That is, a blind mate connector (e.g., respective portions of the connector) can connect (e.g., mate) a TBB and/or an electronic device without and/or with reduced manual human interaction (as compared to a manual quick connector). A manual quick connector, by contrast, can include connectors that are manually connected to a TBB and/or other electronic device. As discussed herein, the pair of blind mate connectors 120 can be used to support an upgraded TBB (e.g., a removable TBB) and/or other cooling equipment (e.g., an electronic device with an integrated liquid-cooled cold plate).

Figure 2:
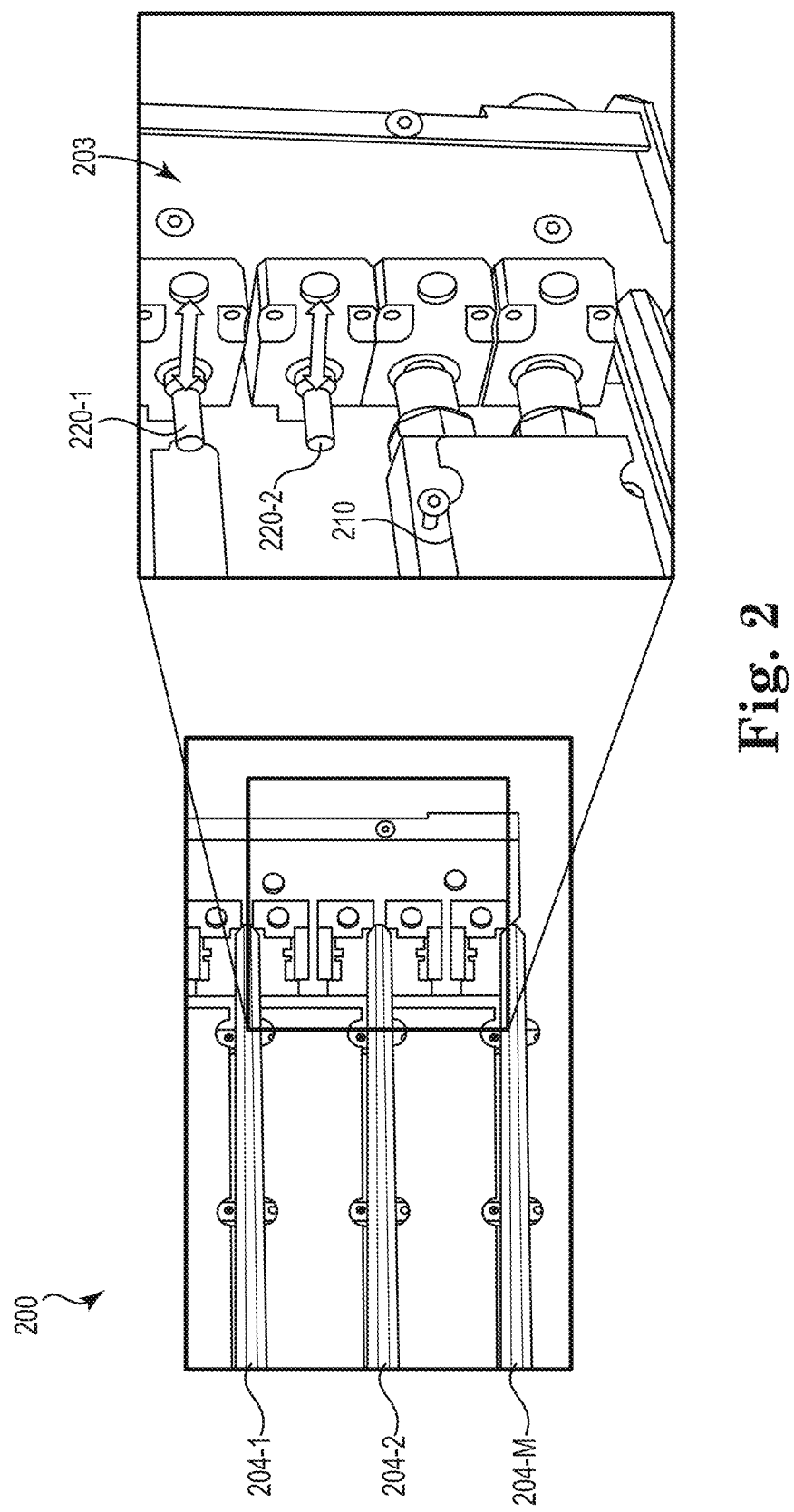
FIG. 2 illustrates a diagram of an example of a pair of connectors on a cooling assembly.

FIG. 2 illustrates a diagram of an example of a pair of connectors on a cooling assembly. As illustrated in FIG. 2, the connectors are a pair of blind mate connectors 220-1, 220-2 on a cooling assembly 200. The cooling assembly 200 can include the same cooling assemblies 100, 200, 400, illustrated by FIGS. 1, 2, and 4 in some examples. The pair of blind mate connectors 220-1, 220-2 (e.g., respective portions of the blind mate connectors) can be used to support a manifold, a TBB (e.g., a removable TBB) and/or an electronic device with integrated cooling.

The cooling assembly 200 can include a plurality of shelves 204-1, 204-2, 204-M forming a plurality of cooling bays. A TBB can be installed in at least a subset of the plurality of cooling bays to provide liquid cooling to electronic devices. For example, a TBB is illustrated as being installed in each of the plurality of cooling bays.

The cooling assembly 200 can include wall structure 203 and a plurality of shelves 204-1, 204-2, 204-M. The cooling assembly 200 can be, for example, installed in a rack and electronic devices can be installed in the rack in thermal contact (e.g., fluidic contact) with the cooling assembly 200. For example, an electronic device can be in thermal contact with a particular TBB.

The wall structure 203, in some examples, can be of a particular height, and the shelves 204 can be installed at incremental heights along the wall structure 203. For example, the wall structure 203 can be a height of 10 U and the shelves 204 can be installed at 1 U increments.

The shelves 204 can form a plurality of slots. A TBB can be installed in a cooling bay of one of the plurality of slots to provide liquid cooling to an electronic device. The cooling bay can include a pair of connectors, as described herein, and the TBB installed in the cooling bay can be connected to the pair of connectors. For example, as illustrated by FIG. 2, a TBB 210 can be installed in at least a subset of the plurality of cooling bays to provide liquid cooling to a subset of a plurality of electronic devices.

In a number of examples, each of the plurality of cooling bays can include a pair of connectors to support TBBs (e.g., to allow fluid flow through the TBBs and/or to provide liquid cooling to an electronic device), to allow for upgrading the TBBs, and/or to support alternative cooling techniques. For example, each cooling bay can include a pair of blind mate connectors located at the back and/or front of the wall structure 203. A TBB installed in a respective cooling bay can connect to the pair of blind mate connectors located in the respective cooling bay. Liquid can be provided to and removed from the TBB using the blind mate connectors.

The TBB 210 can be installed laterally along the wall structure 203. For example, the wall structure 203 can include a vertical support (e.g., frame) and the shelves 204 can be removably attached to the wall structure 203. The shelves 204 can extend out from the wall structure 203 in a direction that is perpendicular to the wall structure 203. For example, the shelves 204 can extend out from the wall structure 203 in a horizontal direction to create a flat horizontal surface. The shelves 204 can form the cooling bays (e.g., a space designed to hold cooling equipment and/or other devices). The TBB 210 can be slid into the cooling assembly in the cooling bay, for instance, each bay is to receive a particular TBB. For example, the TBB 210 can be positioned laterally along the wall structure 203 and can extend the length of the shelves 204. The TBB 210 can, for instance, extend in a parallel direction to the direction that the shelves 204 extend. The TBB 210 can connect to a pair of connectors at the back (or front) of the cooling assembly 200 (e.g., the wall structure) in the cooling bay, as further discussed herein, to provide liquid to the TBB 210.

As illustrated by the exploded view of FIG. 2, the cooling assembly 200 can include a pair of blind mate connectors at the back or front of the cooling assembly 200 (e.g., the back or front of the wall structure) in the cooling bay. A front of the cooling assembly can include a side of the cooling assembly that the TBBs and/or other cooling equipment are installed in. The back of the cooling assembly, as used herein, can include an opposite side of the front of the cooling assembly.

For example, two blind mate connectors can be located at the back and/or front of the cooling assembly 200 in each cooling bay. The pair of blind mate connectors in each cooling bay can include connection points between inlet and outlet channels and the TBBs and/or other electronic devices with integrated cooling. For example, two blind mate connectors can connect to the particular TBB 210.

A gap between the electronic device and the TBB can exist in some instances. However, in order to cool the electronic device using the TBB, a thermal contact (e.g., fluidic contact) can be created. The blind mate connectors (e.g., blind mate connectors 220-1, 220-2) can translate in a horizontal direction relative to the TBB and/or the electronic device to remove the gap and to create a thermal contact between the electronic device and the TBB. For example, in the case of a removable TBB, a portion (e.g., a first portion) of the connector may be attached to a tray and/or an electronic device and another portion (e.g., a second portion) of the connector may be attached to a manifold such that the portion of the connector attached to the manifold can translate in a manner to remove a gap and/or correct for misalignment between the portion of the connector attached to the tray and the another portion of the connector. The horizontal direction can include a left or a right direction, in some examples. For example, the translation can include a direction that is parallel to the direction that the shelves extend out from the wall structure.

Further, the blind mate connectors can be used to support an electronic device with integrated cooling. Example electronic devices with integrated cooling can include an electronic device with an integrated liquid-cooled cold plate, and/or SoC or a three-dimensional integrated packet with integrated liquid cooling, among other devices. An integrated liquid-cooled cold plate can include a cold plate located within the electronic device. Cold liquid can be circulated through the liquid-cooled cold plate to remove heat from the heat-emitting components of the electronic device. A heat exchanger can be coupled to the liquid-cooled cold plate. The blind mate connectors can be used to connect the integrated liquid-cooled cold plate to a cooling fluid source (i.e., a cooling base), as previously discussed.

Figure 3:
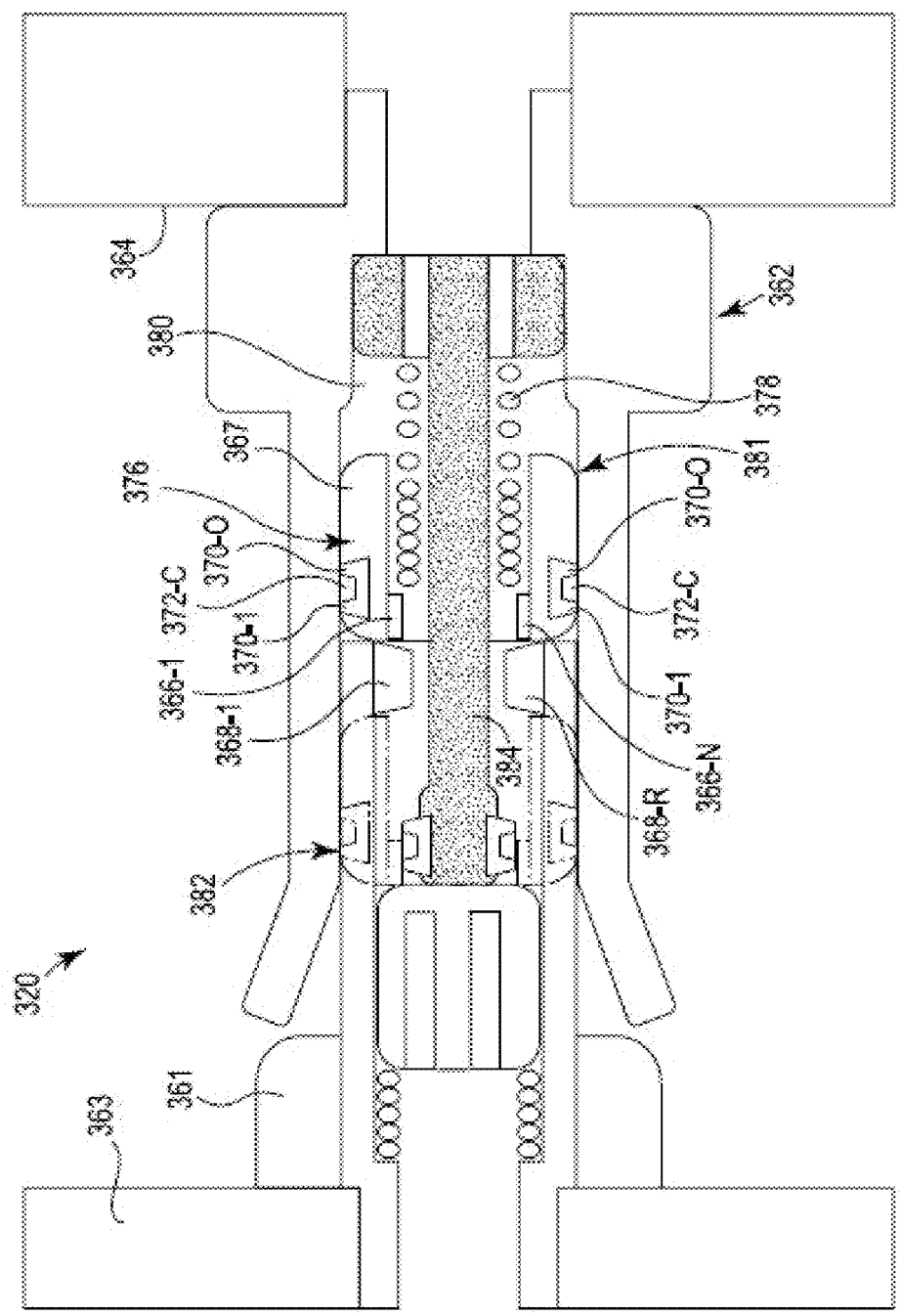
FIG. 3 illustrates a cross-section of an example of a connector on a cooling assembly.

FIG. 3 illustrates a cross-section of an example of a connector 320 on a cooling assembly. The connector 320 can be analogous or similar to the connectors 220-1, 220-2. In various examples, the connector 320 is a blind mate connector, as described herein. The connector can be formed of a first portion 361 and a second portion 362. The first portion 361 can include a housing coupled to an electronic device.

The second portion 362 can include a housing coupled to a cooling fluid source 364. The first portion 361 and the second portion 362 can translate in a horizontal direction the electronic device to remove a gap between the first and second portion and to create a thermal contact between an electronic device 363 and the cooling fluid source 364 (i.e., thermal contact between the first portion 361 and the second portion 362). The horizontal direction can include a left or a right direction, in some examples. However, the present disclosure is not so limited. That is the horizontal direct can include movement in any plane suitable to promote a magnetic fluid connector, as described herein.

The connector includes an internal fluid path 380 is defined by the first portion 361 and the second portion 362 when the first portion and the second portion are coupled together. The internal fluid path can allow cooling fluid to flow along the internal fluid path, for example, from the cooling fluid source 364 to the TBB (not shown) to the electronic device 363, among other possibilities.

In various examples, the connector includes a movable member 376 that is movable to seal the internal fluid path. The movable member is movable from a first position 381 illustrated as corresponding to the location of the plug 367 in FIG. 3 to a second position 382. The movable member can seal the internal fluid path 380 when in the first position 381 and can permit fluid flow when in the second position 382. The second position 382 refers to non-mated configurations (i.e., the first portion 361 and the second portion 362 of the connector 320 are not coupled) where a movable member (e.g., plug 367 of movable member 376) seals an fluid path within the first and/or second portions of the connector 320 (i.e., seals at least a portions of what is the internal fluid path 380 defined by the first portion and the second portion when the first portion and the second portion are coupled together).

The movable member can include a stem 384 and a plug 367. In some examples, a magnet, as described herein, forms at least a portion of the plug. In various examples, the connector 320 includes an internal seal formed by dual sealing members 370-1, 370-O (e.g., O-rings). The dual sealing members 370-1, 370-O can be formed of a plastic, rubber, among other suitable materials or combinations of materials to form the internal seal. In various examples, additional sealing members (not shown for ease of illustration) formed of a plastic, rubber, among other suitable materials or combinations of materials are included in the first portion 361 and/or the second portion 362 to form at least a portion of a seal during when the first portion and second portion of the connector are coupled and/or decoupled.

A gap 372-C is formed between the dual sealing members 370-1, 370-O. Such a gap can facilitate positioning of lubricant in the gap 327-C such that lubricant is positioned in at least a portion of a volume of a gap 327-C between the dual sealing members 370-1, 370-O to promote lubrication of the movable member 376 (e.g., during operations such a coupling and/or decoupling of the connector 320). Put another way, the lubricant in the gap 327-C can provided continued lubrication for the movable member 376 along at least a portion of its path of travel to and/or from the first position 381 and the second position 382, in contrast to other approaches the rely on manual introduction and/or reintroduction of lubricant to movable components, among other benefits. That is, in some example, the movable member 376 includes an internal seal formed by the dual sealing members 370-1, 370-O. While FIG. 3 illustrates a total of two dual sealing members included in the movable member, this disclosure is not so limited. Rather, the total number of the dual sealing members and/or a location of the dual sealing members and therefor the gap between may be varied within the connector 320 to promote magnetic fluid connectors, as described herein.

The connector 320 can include a spring, for instance, spring 378 illustrated in FIG. 3 as surrounding at least a portion of the movable member. The spring 378 can, in various examples, provide a portion of the force sufficient to seal the internal fluid path 380. Internal fluid path can allow cooling fluid to flow to and/or from the electronic device 363 and the TBB.

A magnet such as magnets 366-1, 366-N provides at least a portion of a force sufficient to seal the internal fluid path 380 of the connector 320. For example, the magnets 366-1, 366-N can be adjacent to magnetic regions 368-1, 368-R to have a magnetic force there between (e.g., a magnetic attraction between the magnets 366-1, 366-N and the corresponding magnetic regions 368-1, 368-R) that provides at least a portion of the force to seal the internal fluid path 380. Such a force can facilitate and/or otherwise promote movement of the movable member 376 from the first position 381 to the second position 382. Magnetic regions can themselves be formed of magnetic material and/or can be formed of materials (e.g., iron based materials) suitable to facilitate a magnetic force between the magnetic region and a corresponding magnet.

The force (e.g., magnetic attraction between the magnet and a magnetic region) is maintained at least until the movable member 376 seals the internal fluid path 380 and/or the movable member reaches the second position 382. Put another way, magnetic attraction can be maintained while the magnetic regions and magnets are in contact and/or are spaced apart a comparatively small distances over which at least a portion of the magnetic attraction is maintained between the magnet and the magnetic region. In some examples, the force sufficient to seal the internal fluid path is provided by an aggregate of respective forces provided by the magnet and the spring 378 associated with the movable member.

In some examples, a magnetic region (e.g., magnetic regions 368-1, 368-R) can form at least some of a face of the second portion 362 or the first portion 361 and where a magnet (e.g., magnets 366-1, 366-N) that forms at least some of a face of the other of the first portion 361 or the second portion 362 so the magnet is adjacent to the magnetic region when the first portion and the second portion are coupled together. For example, the magnetic region can form at least some of a face of the second portion and the magnet can form at least some of a face of the first portion so the magnet is adjacent to the magnetic region when the first portion and the second portion are coupled together.

The magnet is located within a housing of the connector 320. In various examples, the magnet is included in one of the first portion of the connector or a second portion of the connector and a magnetic region included in the other of the first portion or the second portion. In some examples, the magnets 366-1, 366-N form at least a portion of the plug 367, as illustrated in FIG. 3.

The magnet can be a permanent magnet and/or non-electromagnetic magnet. That is, in some examples, the magnet such as magnet 366-1, 366-N are permanent magnets, not electromagnets.

As illustrated in FIG. 3, the connector 320 can include two magnets included in the movable member 376 of the second portion 362 of the connector 320. In such an example, the first portion includes a magnetic region, for instance, magnetic regions 368-1 and 368-R. Thus, the magnetic region can have a corresponding magnet. However, while FIG. 3 illustrates two magnets on a face of the movable member 376, this disclosure is not so limited. That is, at total number of magnets (e.g., two magnets), a total number of magnetic regions, and/or a location of the magnet and/or magnetic regions, among other aspects, can be varied to promote a magnetic fluid connector, as described herein. For example, the connector can include a single magnets and/or magnetic regions and/or the magnet can be located in the first portion 361 of the connector 320.

In some examples, at least a portion of a housing of the one of the first portion of the connector or the second portion of the connector including the magnet is formed of a non-magnetic material. For instance, in the examples illustrated in FIG. 3, the housing of the second portion 362 or the connector 320 is formed of a non-magnetic material and/or combinations of non-magnetic materials such as plastic, aluminum, stainless steel (e.g., stainless steel with sufficiently high nickel content to be non-magnetic), etc., and/or combinations thereof such that the magnet (e.g., magnets 366-1, 366-N) do not magnetically interact with the housing of the second portion 362 of the connector 320. Similarly the stem 384 and/or portions of the moveable member 376 can be formed of non-magnetic material and/or combinations of non-magnetic materials.

Figure 4:
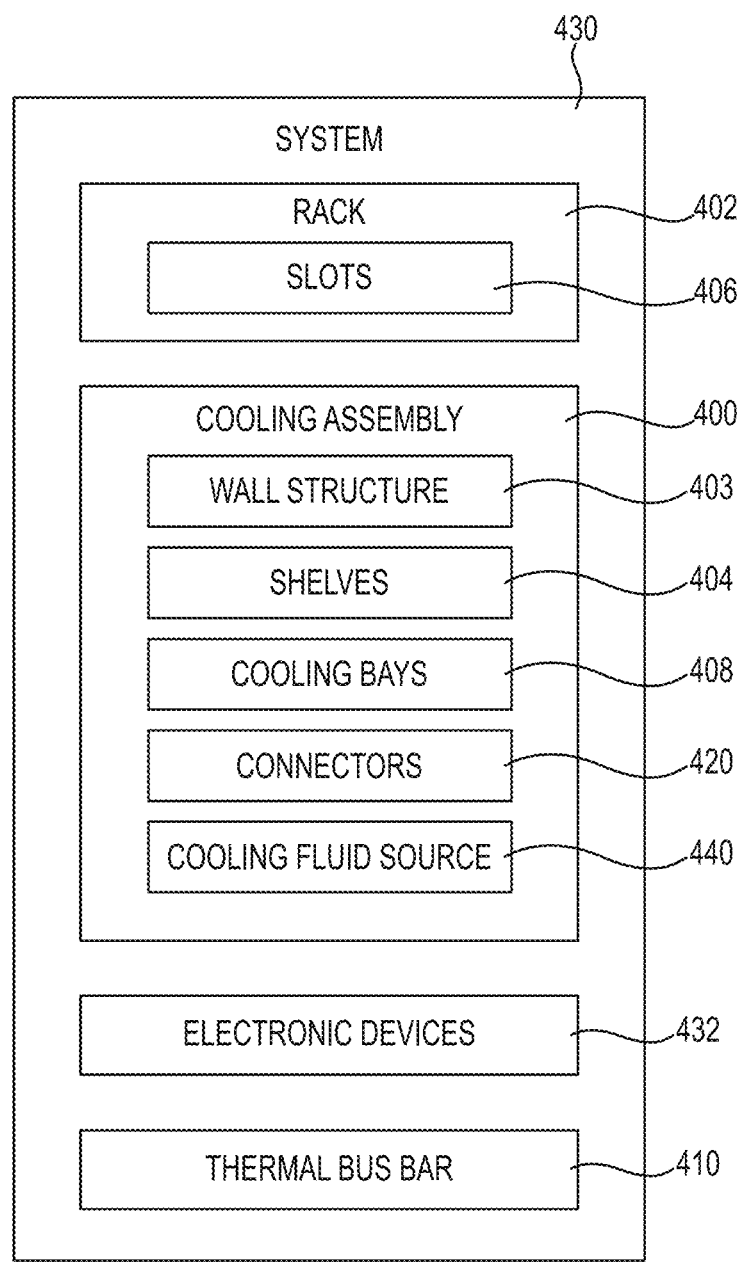
FIG. 4 illustrates a diagram of an example of a system suitable with magnetic fluid connectors.

FIG. 4 illustrates a diagram of an example of a system suitable with magnetic fluid connectors. The system 430 can include a rack 402 with a plurality of slots 406 to support a plurality of electronic devices 432. As previously discussed, a cooling assembly 400 can be installed in the rack 402. For example the cooling assembly 400 can include a wall structure 403 and a plurality of shelves 404 on the wall structure 403 forming a plurality of cooling bays 408. Each cooling bay can be located in and/or associated with one of the plurality of slots 406 and each cooling bay can include a pair of blind mate connectors 420.

Further, the system 430 can include a plurality of electronic devices 432. Each of the plurality of electronic devices can be installed in one of the plurality of slots 406 and can be supported by at least one of the plurality of shelves 404.

A plurality of TBBs 410 can be installed in the cooling assembly 400. For example, the plurality of TBBs 410 can be installed in at least a subset of the plurality of cooling bays 408. A plurality of TBBs installed in at least a subset of the plurality of cooling bays 408, as used herein, refers to a single TBB installed in each of the at least subset of the plurality of cooling bays 408.

An installed TBB 410 can be connected to a pair of the blind mate connectors 420. That is, each TBB 410 installed can be connected to one of the pairs of blind mate connectors 420. The TBBs 410 and/or blind mate connectors 420 can provide liquid cooling from a cooling fluid source 440 to at least a subset of the plurality of electronic devices 432.

The rack 402 in accordance with some examples can include a height of 10 U and each of the plurality of slots 406 can include a height of 1 U. Further, one of the plurality of shelves 404 can be removed to support a different electronic device of a greater height than 1 U. As used herein, a rack can include a frame (e.g., metal) that can contain a plurality of servers and/or chassis stacked one above one another.

A server can refer to a rack server, a blade server, a server cartridge, a chassis, a rack, and/or individual loads. A rack server can include a computer that is used as a server and designed to be installed in a rack. A blade server can include a thin, modular electronic circuit board that is housed in a chassis and each blade is a server. A chassis can include an enclosure which can contain multiple blade servers and provide services such as power, cooling, networking, and various interconnects and management. A server cartridge, as used herein, can include a frame (e.g., a case) substantially surrounding a processor, a memory, and a non-volatile storage device coupled to the processor.

In some examples, as previously discussed, at least one of the plurality of cooling bays 408 may not include a TBB (e.g., a removable TBB) installed therein. For example, an electronic device installed in a slot associated with the one cooling bay may be air cooled and/or integrated liquid cooled.

Figure 5:
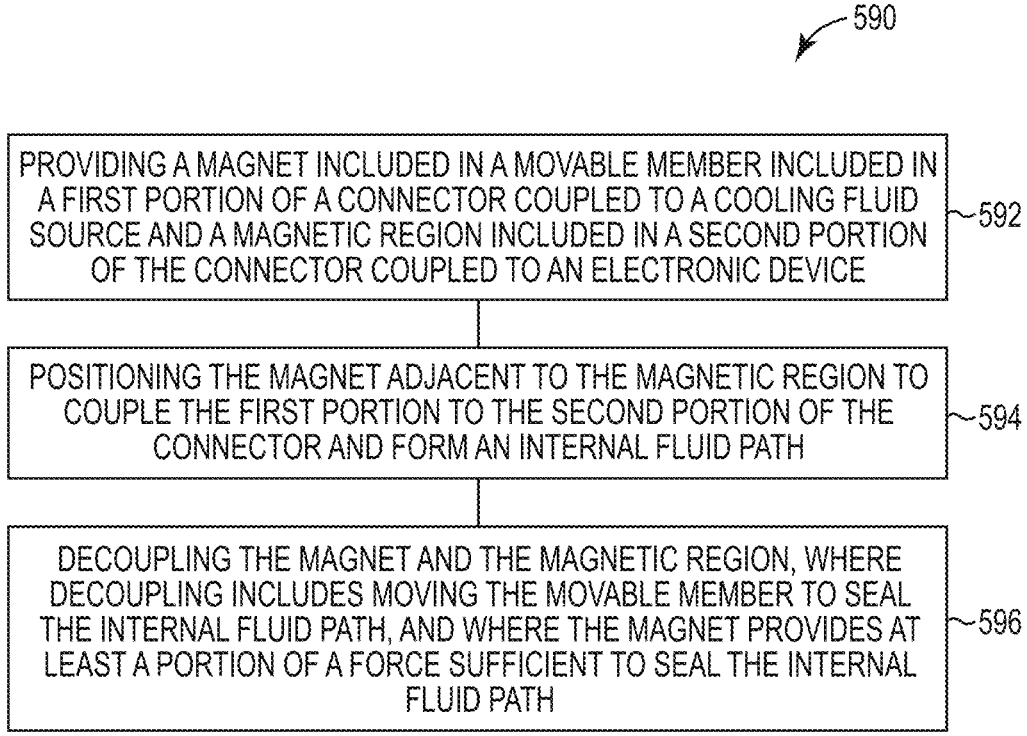
FIG. 5 illustrates a flow diagram of an example of a method suitable with magnetic fluid connectors.

FIG. 5 illustrates a flow diagram of an example of a method of coupling a magnetic fluid connector. As illustrated in FIG. 5, the method 590 can include providing a magnet included in a movable member included in a first portion of a connector coupled to a cooling fluid source and a magnetic region included in a second portion of the connector coupled to an electronic device, as illustrated at 592.

As illustrated at 594, the method 590 can include positioning the magnet adjacent to the magnetic region to couple the first portion to the second portion of the connector and form an internal fluid path. Positioning can include causing movement of an electronic device and/or a cooling assembly coupled to the first portion and/or the second portion of the connectors relative to each other, among other possibilities.

The method 590 can include decoupling the magnet and the magnetic region, as illustrated at 596. For example, decoupling can include moving the movable member to seal the internal fluid path, and where the magnet provides at least a portion of a force sufficient to seal the internal fluid path, as illustrated at 596. Moving the moveable member can occur automatically (e.g., without user interaction), for example, in response to decoupling of the first portion and the second potion.

In some examples, the method can including providing, based upon a reading of an electronic sensor, an indication that the magnet and the magnetic region are coupled together. That is, merely positioning the electronic device adjacent to the cooling assembly may not ensure formation of an internal fluid path (e.g., by a positioning of the magnet adjacent to the magnetic region to couple the first portion to the second portion of the connector) and/or that the fluid path is sealed as intended (e.g., that the plug 367 has retracted fully to a first position). The indication can be an electronic communication (e.g., an email, text, etc.) and/or a graphical indicator (e.g., a color change and/or text in a graphical user display), among other suitable indications to convey to an end user and/or a computing system that the that the magnet and the magnetic region are coupled together (e.g., an internal fluid path has been formed).

In the foregoing detailed description of this disclosure, reference is made to the accompanying drawings that form a part hereof, and in which is shown by way of illustration how examples of the disclosure may be practiced. These examples are described in sufficient detail to enable those of ordinary skill in the art to practice the examples of this disclosure, and it is to be understood that other examples may be utilized and that process, electrical, and/or structural changes may be made without departing from the scope of this disclosure. It will be understood that when an element is referred to as being "on," "connected to", "coupled to", or "coupled with" another element, it can be directly on, connected, or coupled with the other element or intervening elements may be present.

The figures herein follow a numbering convention in which the first digit corresponds to the drawing figure number and the remaining digits identify an element or component in the drawing. Elements shown in the various figures herein can be added, exchanged, and/or eliminated so as to provide a number of additional examples of this disclosure. In addition, the proportion and the relative scale of the elements provided in the figures are intended to illustrate the examples of this disclosure, and should not be taken in a limiting sense. Further, as used herein, "a number of" an element and/or feature can refer to one or more of such elements and/or features.

What is claimed:

1. A liquid connector, comprising:
a first portion comprising a first housing, a plug within the first housing, and a magnet attached to the plug; and
a second portion comprising a second housing to be inserted into the first housing to establish a fluid path through the liquid connector, and a magnetic region attached to the second housing;
wherein as the second housing is inserted into the first housing, the plug is moved by the second housing from a closed position to an open position, and
when the second housing is inserted into the first housing, magnetic attraction between the magnet and the magnetic region generates a first force that presses the plug against the second housing, wherein the first portion comprise a stem inside the first housing, with the plug encircling the stem, and when the plug is in the closed position, the plug contacts the stem and the first housing to prevent liquid from flowing through the first housing.

2. The liquid connector of claim 1,
wherein when the second housing is inserted in first housing and the plug is in the open position, the pressing of the plug against the second housing seals the fluid path relative to an exterior environment.

3. The liquid connector of claim 1,
wherein as the second housing is removed from the first housing, the plug moves to the closed position.

4. The liquid connector of claim 3,
wherein as the second housing is removed from the first housing, the first force pulls the plug towards the closed position.

5. The liquid connector of claim 4,
wherein the first portion includes a spring inside the first housing, and
as the second housing is removed from the first housing, the spring generates a second force that pushes the plug towards the closed position.

6. The liquid connector of claim 3,
wherein the plug prevents liquid from flowing through the first housing when in the closed position and allows liquid to flow through the first housing when in the open position.

7. The liquid connector of claim 1,
wherein the liquid connector is a blind mate liquid connector.

8. The liquid connector of claim 1,
wherein the first portion includes a spring inside the first housing, and
when the second housing is inserted into the first housing, the spring generates a second force pressing the plug against the second housing.

9. The liquid connector of claim 8,
wherein the first force and the second force together press the plug against the second housing sufficiently to seal the fluid path relative to an exterior environment.

10. The liquid connector of claim 1,
wherein the second portion includes a second plug inside the second housing, and
the stem is to, as the second housing is inserted into the first housing, force the second plug to move from a closed position to an open position.

11. A liquid connector, comprising:
a first portion comprising a first housing, a plug within the first housing, and a magnetic region attached to the plug; and
a second portion comprising a second housing to be inserted into the first housing to establish a fluid path through the liquid connector, and a magnet attached to the second housing;
wherein as the second housing is inserted into the first housing, the plug is moved by the second housing from a closed position to an open position, and
when the second housing is inserted into the first housing, magnetic attraction between the magnet and the magnetic region generates a first force that presses the plug against the second housing, wherein the first portion includes a spring inside the first housing, and when the second housing is inserted into the first housing, the spring generates a second force pressing the plug against the second housing.

12. The liquid connector of claim 11,
wherein when the second housing is inserted in first housing, the pressing of the plug against the second housing seals the fluid path relative to an exterior environment.

13. The liquid connector of claim 11,
wherein as the second housing is removed from the first housing, the plug moves to the closed position.

14. The liquid connector of claim 13,
wherein as the second housing is removed from the first housing, the first force pulls the plug towards the closed position.

15. The liquid connector of claim 14,
wherein the first portion includes a spring inside the first housing, and
as the second housing is removed from the first housing, the spring generates a second force that pushes the plug towards the closed position.

16. The liquid connector of claim 13,
wherein the plug prevents liquid from flowing through the first housing when in the closed position and allows liquid to flow through the first housing when in the open position.

17. The liquid connector of claim 11,
wherein the liquid connector is a blind mate liquid connector.

18. The liquid connector of claim 11,
wherein the first force and the second force together press the plug against the second housing sufficiently to seal the fluid path relative to an exterior environment.

19. The liquid connector of claim 11,
wherein the first portion comprise a stem inside the first housing, with the plug encircling the stem, and
when the plug is in the closed position, the plug contacts the stem and the first housing to prevent liquid from flowing through the first housing.

* * * * *